(12) United States Patent
Thomas et al.

(10) Patent No.: US 8,886,142 B2
(45) Date of Patent: **\*Nov. 11, 2014**

(54) METHOD AND APPARATUS FOR SENSING INTER-MODULATION TO IMPROVE RADIO PERFORMANCE IN SINGLE AND DUAL TUNER

(71) Applicant: Panasonic Automotive Systems Corporation of America, division of Panasonic Corporation of North America, Peachtree City, GA (US)

(72) Inventors: Donald Thomas, Smyrna, GA (US);
Jason Hingerton, Atlanta, GA (US);
Tatsuya Fujisawa, Atlanta, GA (US);
Jammie Chu, Royal Oak, MI (US);
Shree Jaisimha, Senoia, GA (US);
Robert Baillargeon, East Amherst, NY (US)

(73) Assignee: Panasonic Automotive Systems Company of America, division of Panasonic Corporation of North America, Peachtree City, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,792

(22) Filed: May 13, 2013

(65) Prior Publication Data

US 2013/0243134 A1  Sep. 19, 2013
US 2014/0161213 A2  Jun. 12, 2014

Related U.S. Application Data

(63) Continuation of application No. 13/010,225, filed on Jan. 20, 2011, now Pat. No. 8,463,216.

(51) Int. Cl.
| | |
|---|---|
| *H04B 1/18* | (2006.01) |
| *H04B 1/08* | (2006.01) |
| *H03J 1/00* | (2006.01) |
| *H04L 25/08* | (2006.01) |
| *H04B 1/26* | (2006.01) |
| *H04H 20/26* | (2008.01) |

(52) U.S. Cl.
CPC .............. *H04L 25/08* (2013.01); *H04B 1/082* (2013.01); *H03J 1/0008* (2013.01); *H04H 20/26* (2013.01); *H04H 2201/60* (2013.01)
USPC ..................................... 455/166.1; 455/184.1

(58) Field of Classification Search
USPC ............................................ 455/166.1–184.1
See application file for complete search history.

(56) References Cited

U.S. PATENT DOCUMENTS 8,463,216 B2 \*  6/2013  Thomas et al. ............ 455/166.1

\* cited by examiner

*Primary Examiner* — Lee Nguyen
(74) *Attorney, Agent, or Firm* — Laurence S. Roach

(57) ABSTRACT

A method of performing alternate frequency switching in a radio includes tuning the radio to a primary frequency. A candidate alternate frequency is identified. It is determined whether the candidate alternate frequency is a third order inter-modulation artifact. Tuning is switched from the primary frequency to the candidate alternate frequency only if it is determined in the determining step that the candidate alternate frequency is not a third order inter-modulation artifact.

20 Claims, 14 Drawing Sheets

| Station List Learn Memory (up to 205 entries) | | | |
|---|---|---|---|
| Index | Quality | Trust Timer | Link |
| 0 | 120 | 600 | 0 |
| 1 | 85 | 600 | 0 |
| ⋮ | ⋮ | | ⋮ |
| ⋮ | ⋮ | ⋮ | ⋮ |

FIG. 10

| Station List Learn Memory (up to 102 entries) | | |
|---|---|---|
| Index | Quality | Trust Timer |
|  |  |  |
|  |  |  |
| . . . . . | . . . . . | . . . |
|  |  | . . . |

METHOD AND APPARATUS FOR SENSING INTER-MODULATION TO IMPROVE RADIO PERFORMANCE IN SINGLE AND DUAL TUNER

CROSS-REFERENCE TO RELATED APPLICATION

This application is a continuation of U.S. patent application Ser. No. 13/010,225, filed on Jan. 20, 2011 which is now U.S. Pat. No. 8,463,216, the disclosure of which is hereby incorporated by reference in its entirety for all purposes.

BACKGROUND OF THE INVENTION

1. Field of the Invention

The present invention relates to radios for use in vehicles, and, more particularly, to improving signal reception quality in radios for use in vehicles.

2. Description of the Related Art

Car radio reception quality is an important element of overall consumer vehicle satisfaction. Consequently, car original equipment manufacturers (OEMs) and suppliers perform extensive in-field testing in different countries to tweak the reception quality to suit each market segment.

Users listening to radios while driving near an AM or FM radio transmission tower may hear two types of distortion. A first type of distortion is front end overload distortion where transmission from a nearby station overwhelms the car radio's RF digital signal processing (DSP) receiver. Front end overload can lead to clipping distortion at the intermediate frequency analog-to-digital conversion chain process. A method to avoid this is to increase the attenuation at the front end and tweak the automatic gain control (AGC) that is prior to the analog-to-digital conversion (ADC) stage. However, since the overload affects the entire FM frequency range, the radio frequency (RF) designer is presented with the challenge of accommodating both strong and weak signal reception in such a scenario.

A second type of distortion is inter-modulation distortion arising from the use of non-linear devices. In the car radio environment, the non-linear devices are primarily the low noise amplifier (LNA) and the heterodyne mixer or mixers depending on whether the heterodyne mixing process is one step 10.7 MHz intermediate frequency or a lower frequency down-shifted base band intermediate frequency operating for low power devices using multi-stage down conversion. The current trend with respect to low power devices is to operate in base band intermediate frequency to ensure that the sampling rate is lower, as this translates into lower power utilization at the analog-to-digital conversion stage onwards.

Inter-modulation occurs when the input to a non-linear device (NLD) is composed of two or more frequencies of high signal levels and results in the creation of frequency artifacts that are a product of the inputs. These artifacts can result in either new 'phantom' stations (e.g., artifacts occur on frequencies where no valid station exists in the vicinity of the car radio) or overlap on a existing valid frequency. When a user tunes to the overlapped frequency, he hears audio modulations from the multiple audio sources including the valid radio station and the modulations arising from station frequencies involved in the creation of the artifacts themselves.

For example, third order inter-modulation can arise from the following permutations:

$$L*f1+/-M*f2+/-N*f3,$$

where f1, f2 and f3 are distinct frequencies and $$L+M+N=3, \quad (1)$$

where L, M and N are integers
Here f1, f2 and f3 are signals over 70 dBuV (which may be calibratable)
OR from $$L*f1+/-M*f2,$$

where f1, f2 are distinct frequencies and $$L+M=3 \quad (2)$$

where L and M are integers
Here f1 and f2 are signals over 70 dBuV (which may be calibratable)

While inter-modulation is typically caused by a car's proximity to strong transmission towers, other causes may originate from inside the car's passenger compartment through the use of powerful in-car FM transmitters which are used to stream audio from an external device (e.g., an iPod or external mp3 player) into a non-receivable FM radio station frequency so that the external audio source can be heard through the car speakers. These devices may output signal levels from 70 to 90 dBuV. Signals of a level exceeding 70 dBuV are considered strong signals and when mixed with other strong signals in the vicinity of the car, can lead to third order inter-modulation artifacts.

While inter-modulation distortion in the car radio can be of second order and third order types, the third order inter-modulation poses a bigger problem than second order inter-modulation. This is because second order inter-modulation can be typically filtered out using the band-pass filter. However, third order inter-modulation is harder to filter out as it lies very close to the center frequency of the frequency tuned by the radio head unit. A filter with characteristics steep enough to filter out third order inter-modulation but leave the tuned frequency intact is difficult to achieve.

Illustrated FIG. 1 is an example of typical prior art RF receiver topology that results in the creation of inter-modulation artifacts. The RF signal from the antenna goes through a low noise amplifier (LNA), which is a non-linear device, and then goes through a band-pass filter which tends to filter out frequencies outside the FM band. The next stage is the mixing with the local oscillator to provide the intermediate frequency. The mixer is also a non-linear device. The output product from the mixer passes through another filter stage to ensure that only the required intermediate frequency is output before the signal is digitally sampled at the RF analog to digital converter (ADC) and then again passes through an intermediate frequency (IF) filter.

FIG. 2 illustrates the characterization or mapping of the input power versus output power of a typical non-linear device. The plotted line 10 represents the third order inter-modulation characterization. The gain of the output inter-modulation product is based on the slope of line 10. For Global A boards, for example, the third order inter-modulation is between 10 and 15 dBuV and is known to cause audio distortion.

Illustrated in FIG. 3 is an example expanded characterization of output power versus input power for a non-linear device. FIG. 3 illustrates a typical model that is used to characterize the level of artifacts created. Line 12 represents the third order inter-modulation characterization.

The level of expected inter-modulation is shown in FIG. 4, which illustrates modeling of third order inter-modulation. The third order input intercept point (IIP3) is in units dBm and is a function of ΔP from the input levels of the fundamental strong frequencies at the input to the non-linear device.

FIG. 5 illustrates the third order intercept point (IP3) inter-modulation power increase for non-linear devices with no saturation. As shown in FIG. 5, the effects of inter-modulation vary based on the RF design and the characteristics of the components used. If the system has no saturation, then the third order inter-modulation can be as high as the fundamental frequencies at the input of the non-linear device.

FIG. 6 also illustrates IP3 inter-modulation power increase for non-linear devices with no saturation. As shown in FIG. 6, the third order inter-modulation effects depend on the performance of the gain stages at the latter part of the RF chain. This is true because the gain value increases geometrically towards ($G_n$) at the end of the chain.

FIG. 7 illustrates a characterization of the problem posed by third order inter-modulation. FIG. 7 highlights the reason why it is difficult to filter out the third order inter-modulation artifacts. While the second order harmonics are outside the pass band, the third order inter-modulations such as 2f1−f2 and 2f2−f1 are very close to the fundamental frequencies f1 and f2 (where f1 and f2 are strong signals of 70 dBuV or above). Because of the difficulty in filtering the third order inter-modulations, this poses a serious reception problem.

Accordingly, what is neither anticipated nor obvious in view of the prior art is a method of sensing inter-modulation distortion and mitigating its effects on signal reception quality.

SUMMARY OF THE INVENTION

The present invention may provide a method of using known car radio hardware architecture in conjunction with a novel software algorithm to thereby sense and mitigate inter-modulation artifacts and improve the overall performance of the car radio reception quality.

There are several end applications contemplated for the present invention with respect to the car radio. A first end application is to improve single and dual tuner alternative frequency switch behavior. Global A radios have a test route which exhibits a classical use case: On Mount Taunus in Germany, there exists two strong transmitters operating at 102.5 MHz and 105.9 MHz. These two strong signals (over 90 dBuV) result in a third order inter-modulation product (2×102.5)−105.9=99.1 MHz. Also in the vicinity (2×96.7)−94.3=99.1 MHz, another intermodulation is produced on the same frequency. When the user is tuned to station SWR1 and drives up the mountain, an unwanted alternative frequency (AF) switch occurs to the strongest station (99.1 MHz) which has good quality and yields a proper Program ID code prior to the switch. However when the radio switches to this station, the user hears distorted audio artifacts where there are audio products from three separate stations (SWR1+station operating 102.5 MHz and station operating 105.9 MHz). In the above scenario, with regards to audio quality, the reception quality can be improved if the radio switches to an alternate frequency that is of secondary signal quality rather than the strongest quality, and that is not an inter-modulation product, thus yielding better audio quality performance.

A second end application of the invention is radio data system (RDS) preset recall/digital audio broadcasting (DAB) FM link performance enhancement. Preset recall or DAB FM link to an RDS station involves tuning by Program ID code rather than frequency. Herein the radio checks all the best alternative frequencies associated with the Program ID code and tunes to the best alternative frequency with the criteria being signal quality and the frequency transmits the Program ID code. With inter-modulation at play the radio risks tuning to a station that is an inter-modulation product. This results in the end user tuning to a station whose audio quality is composed of the inter-modulating frequencies and the actual audio content.

A third end application of the invention is autoseek performance enhancement. A car radio parked or being driven near a transmission tower may need to ensure that it does not seek stops on inter-modulation tainted frequencies even if the quality of these stations are considered good and within limits with respect to field-strength levels, multipath, ultrasonic and frequency offset metrics.

A fourth end application of the invention is to optimize distortion artifacts during manual tune operation. In the event that the user especially wants to listen to a station frequency through direct tune or manual tune operation, the radio, upon detecting that the frequency has inter-modulation artifacts, can choose to adjust the automatic gain control to improve audio quality.

The present invention may provide a mechanism to detect inter-modulation in single tuner and dual tuner radios and utilize this apriori information in avoiding the inter-modulation artifacts. The inventive method may accommodate the case in which the car moves away from the strong signal transmitters, or when the in-car FM transmitters have been turned off. The invention may enable the car radio to recognize that inter-modulation artifacts are no longer present and thus adapt itself.

The inventive method may detect the inter-modulation and use this apriori information to improve the performance of a number of applications. Specifically, the method may improve RDS AF switching behavior in single and dual tuner radios by ensuring that the radio does not switch to a tainted inter-modulation frequency. The method may also improve RDS Preset recall performance by ensuring that the tune by PI code ensures that the alternative frequency picked for reception is not a frequency tainted by inter-modulation artifacts. The method may further improve auto-seek seek stop performance in the FM mode to ensure that seek stop does not occur at a frequency associated with an inter-modulation artifact.

In Europe, DAB FM link occurs when a user is tuned to a digital DAB station. When the bit error rate (BER) increases, the decoding of the MP2 compressed audio stream becomes difficult for the DAB receiver. In such a circumstance, the radio typically falls back on the simulcast FM station frequency to produce audio. FM stations in Europe employ RDS which categories stations with a program ID code whereby multiple frequencies are associated with a single station. In such a case, a tune by PI operation of the present invention to trigger the DAB FM link may ensure that the final strongest alternative frequency picked for tune operation in the FM band is not an inter-modulation artifact.

The present invention may be applied to AF switching in either a single or double tuner environment. European countries embrace the full features set out by the RDS standard which is AF switching. The way this scheme works is that low power transmitters encompass the European FM landscape. A station operates under different frequencies whereby audio on all these alternate frequencies consists of simulcast audio and data information from the station.

A single tuner radio operating in this environment, when tuned to a RDS station, may receive the AF that the radio can switch to in case the currently tuned-to frequency fades in signal quality. Before an actual switch is done, the single tuner RDS radio may typically perform quality checks, such as for fieldstrength, multipath, adjacent channel energy, and frequency offset, for example. After the quality checks have been performed, and the AF is noted to be better than the currently tuned-to station frequency, the radio may switch over to this stronger AF after a mute operation and delve on this target station for a program ID code check. The program ID confirms that the station being switched to is transmitting the same audio as the most recently tuned-to station. This may result in mutes which can vary in time duration based on the time used for the PI wait time. The mute time duration may range between 500 ms and 1500 ms depending on the RDS block error rate, which may be affected by frequency offset errors, multi-path and/or adjacent channel activity, assuming the sampled signal is of good quality (e.g., 32 dBuV or above for field strength). If the PI code (a sixteen bit word termed "program identification code" and defined in the RBDS standard) matches the PI code of the last tuned-to station, then the AF switch occur, and an unmute of audio is performed. If the PI code does not match the sampled AF, then the radio switches back to the originally tuned-to station and unmutes. The latter is a partly failed AF switch attempt as the radio transmitter list of alternate frequencies is not fully correct because either these station frequencies are operating as regional variants, or a true case of co-channel situation exists such that the frequencies can carry different audio content.

When the PI code cannot be received, then the alternate frequency switch may be delayed.

Muted PI checks may be performed for single tuner variants. OEM customers require this program ID check partly to reduce the risk of potentially switching over to a different station (with different audio modulation) and are willing to tolerate the mute. However, in order to prevent too many mutes from occurring, what is referred to as a "trust timer" is used to perform an un-muted alternate frequency switch. The trust timer may minimize the number of audible mutes.

The way this scheme works is that after acquiring the PI code through a mute, typically a trust timer is set for the frequency. The trust timer is usually a counting up timer starting from 0 seconds (the time at which the PI code is received) to a maximum of 15 minutes. The way this trust timer helps in reducing the number of mutes is such that once a single tuner radio sets the trust timer, the radio can potentially switch over to this station frequency in what is termed an unmuted PI check (frequency is switched without muting the audio) during the valid duration of the trust timer as specified by the developer. The duration of the trust timer specified by the developer can vary based on the locality and proximity of the radio stations. This approach of using a trust timer may not work well, however, in certain FM landscapes where co-channel frequency exists, e.g., where a second station uses the same alternate frequency known to the radio. In this instance, an unmuted AF switch can result in what is termed a "wrong audio modulation" lasting from the time the AF switch occurs, the radio variant tunes to this new station, senses through the reception that the new station has the wrong PI code, and finally reacts by switching back to the original frequency. To prevent the software from using the sampled frequency, what may be referred to as a "disable timer" may be set.

In summary of the above limitations on the operation of a single tuner RDS radio, there may be mutes during a PI code switch. An unmuted AF switch based on the trust timer can reduce mutes but does not combat against wrong modulation in case frequencies are reused by different stations. Stations in Europe also operate as regional variant stations. Single tuner radio variants have these operational limitations because there is no luxury of a second tuner to perform background scanning and inaudible PI checks.

The method of the present invention adds a third degree of optimization by performing the PI check only for alternative frequencies that are presented to the car radio and that are not third order inter-modulation artifacts. The way such alternative frequencies may be sensed in a single tuner is through the use of information gathered in the frequency learn memory of the frequencies in the FM band.

The invention comprises, in one form thereof, a method of performing alternate frequency switching in a radio, including tuning the radio to a primary frequency. A candidate alternate frequency is identified. It is determined whether the candidate alternate frequency is a third order inter-modulation artifact. Tuning is switched from the primary frequency to the candidate alternate frequency only if it is determined in the determining step that the candidate alternate frequency is not a third order inter-modulation artifact.

The invention comprises, in another form thereof, a method of performing autoseek in a radio, including scanning a radio frequency band for a candidate frequency having a quality exceeding a threshold quality level. It is determined whether the candidate frequency is a third order inter-modulation artifact. The radio is tuned to the candidate frequency only if it is determined in the determining step that the candidate frequency is not a third order inter-modulation artifact.

The invention comprises, in yet another form thereof, a method of automatically tuning an FM radio to a frequency, including identifying a plurality of first frequencies within an FM band that have a signal quality above a threshold level. A plurality of second frequencies that are third order inter-modulation artifacts of the first frequencies are calculated. Tuning to the second frequencies is avoided.

An advantage of the present invention is that it prevents the radio from tuning to a third order inter-modulation artifact in autoseek, AF switching, and DAB FM Link operations.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 10 is a table depicting one embodiment of a frequency learn memory used to gather apriori information for the European market according to the invention.

FIG. 11 is a table depicting one embodiment of a frequency learn memory for the North American market according to the invention.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

In one embodiment, the method enables the radio to build up signal level metrics of frequencies in the FM band in a memory repository and then utilize the information using the formulae such as (1) and (2) below in identifying the artifact:

$$L*f1+/-M*f2+/-N*f3,$$

where f1, f2 and f3 are distinct frequencies and $$L+M+N=3, \quad (1)$$

where L, M and N are integers
OR from $$L*f1+/-M*f2,$$

where f1, f2 are distinct frequencies and $$L+M=3, \quad (2)$$

where L and M are integers

The way the information is updated in the repository memory area may vary between single and dual tuner.

Figure 1:
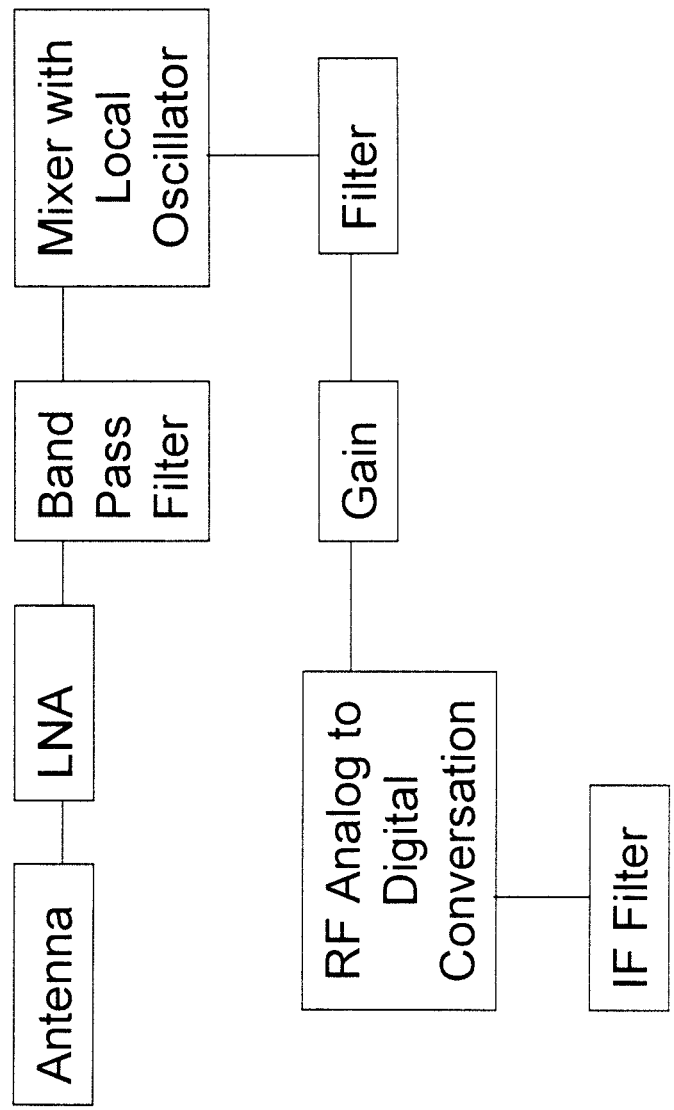
FIG. 1 is a block diagram illustrating an example of typical prior art RF receiver topology that results in the creation of inter-modulation artifacts.
Figure 2:
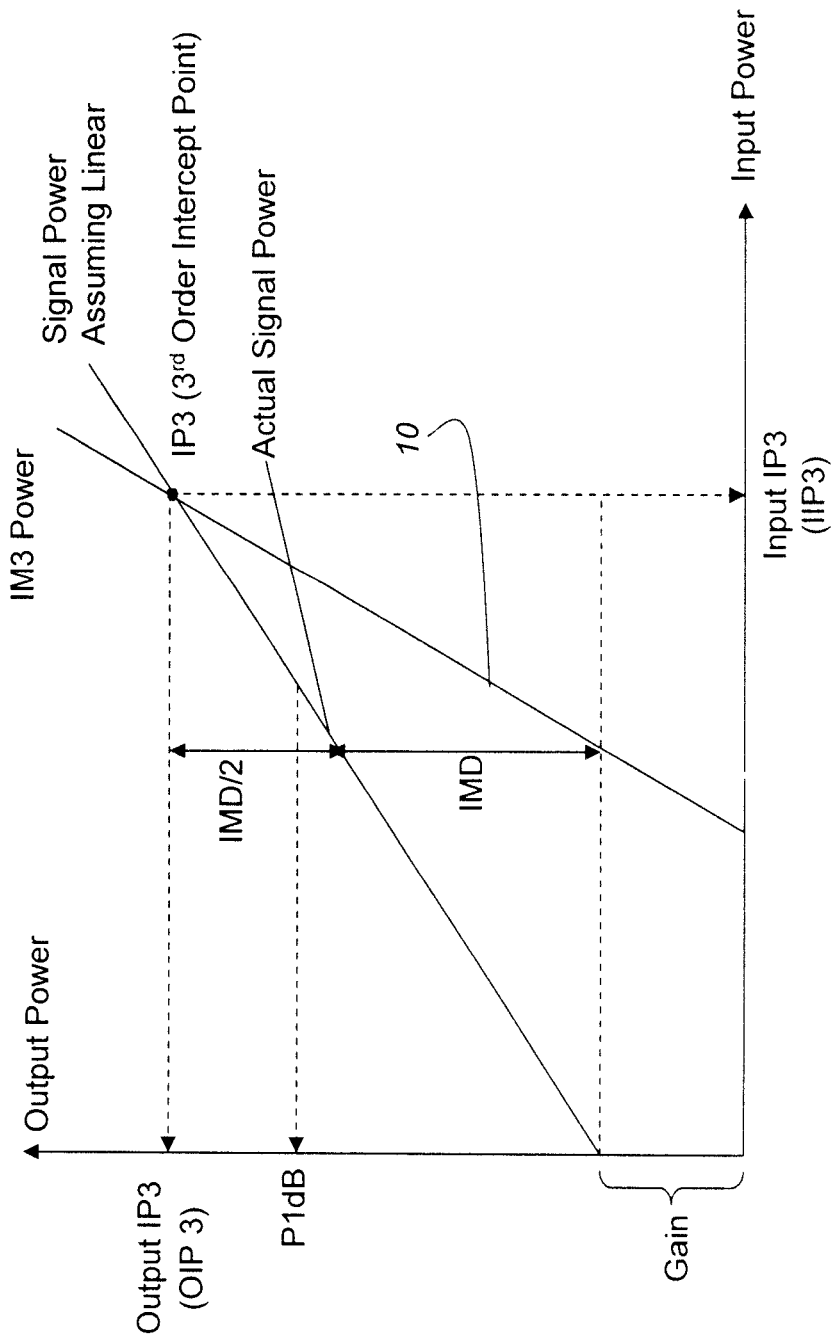
FIG. 2 is a plot of the input power versus output power of a typical non-linear device.
Figure 3:
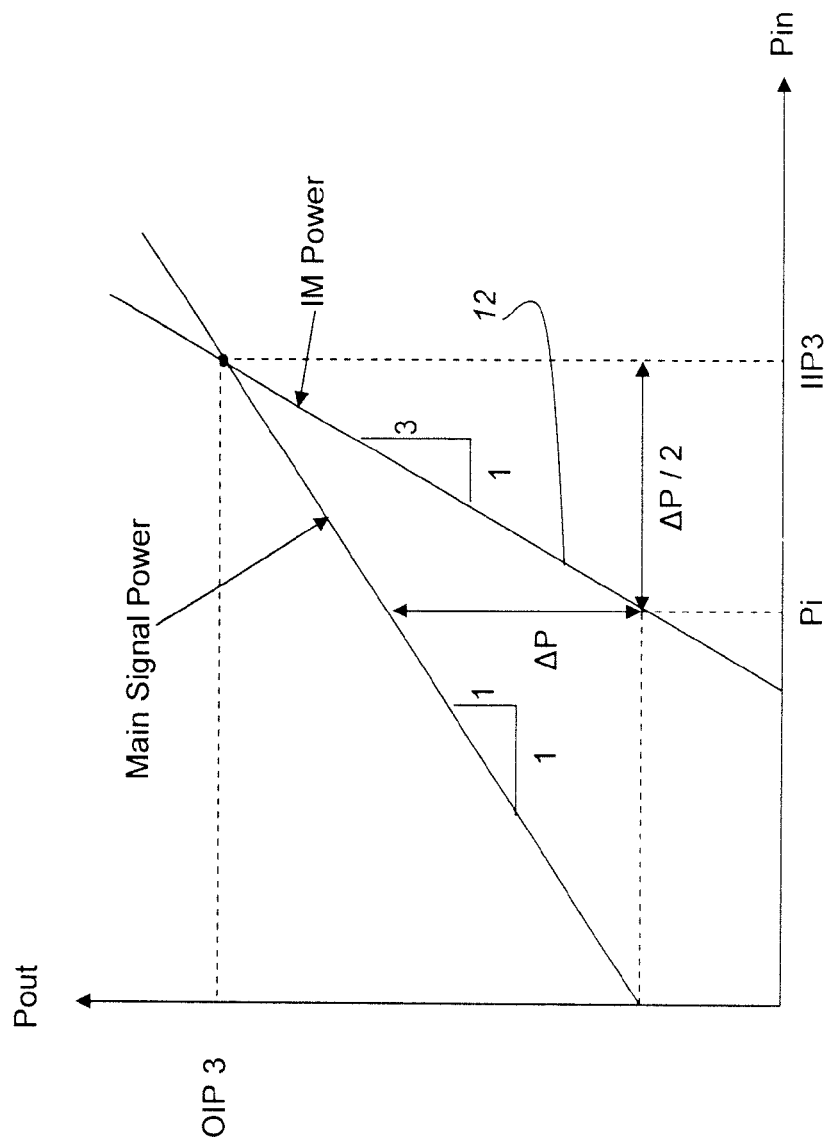
FIG. 3 is an example expanded plot of output power versus input power for a typical non-linear device.
Figure 4:
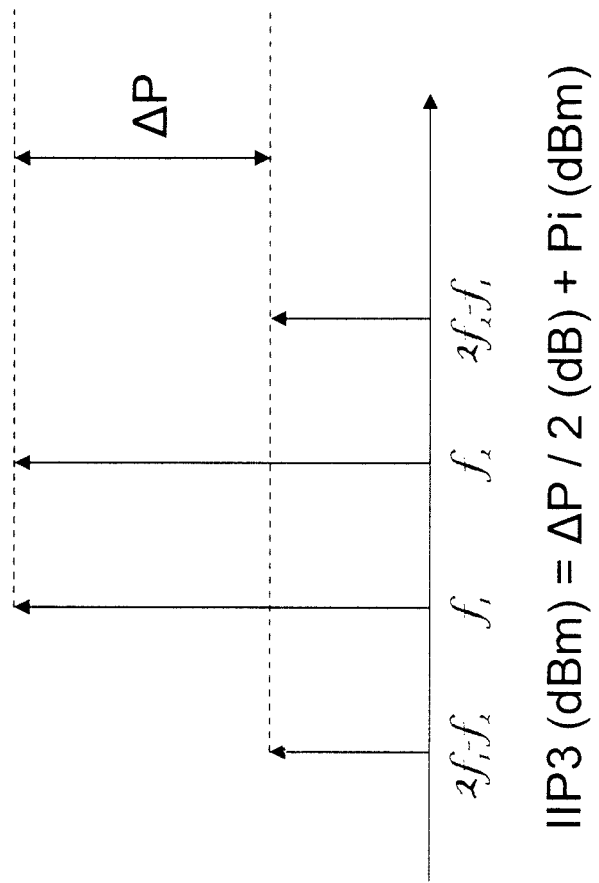
FIG. 4 is a plot of frequency versus a level of expected third order inter-modulation.
Figure 5:
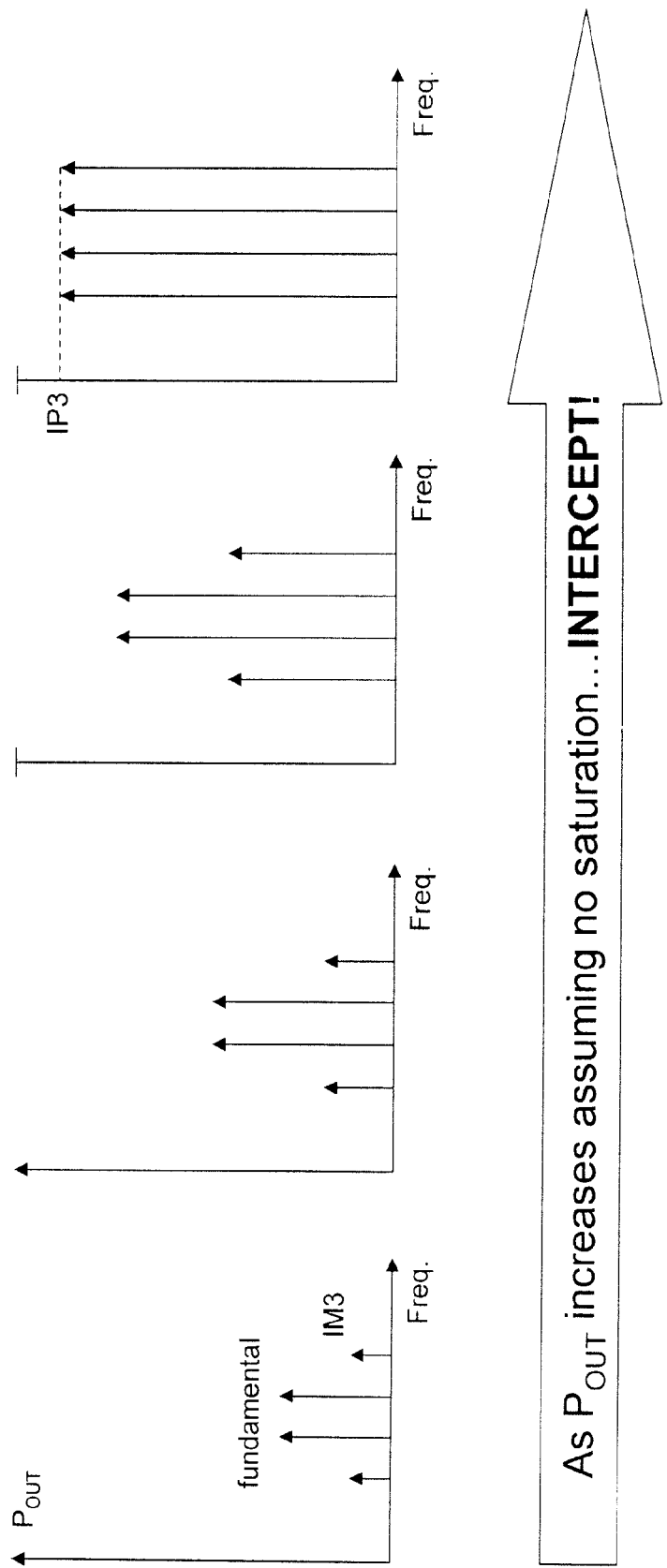
FIG. 5 is a series of plots illustrating the third order intercept point (IP3) inter-modulation power increase versus frequency for non-linear devices with no saturation.
Figure 6:
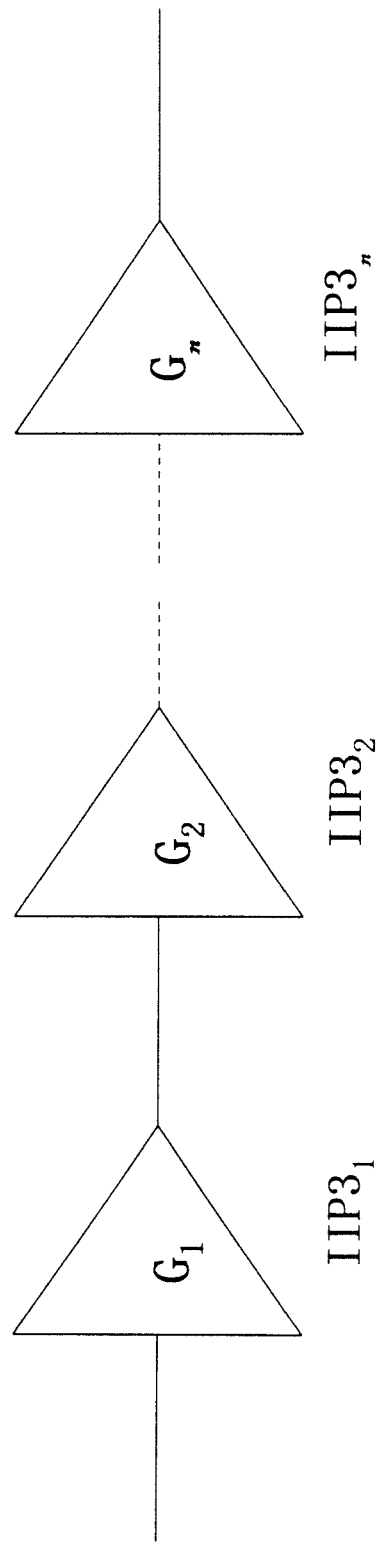
FIG. 6 is a schematic illustration of IP3 inter-modulation power increase for non-linear devices with no saturation.
Figure 7:
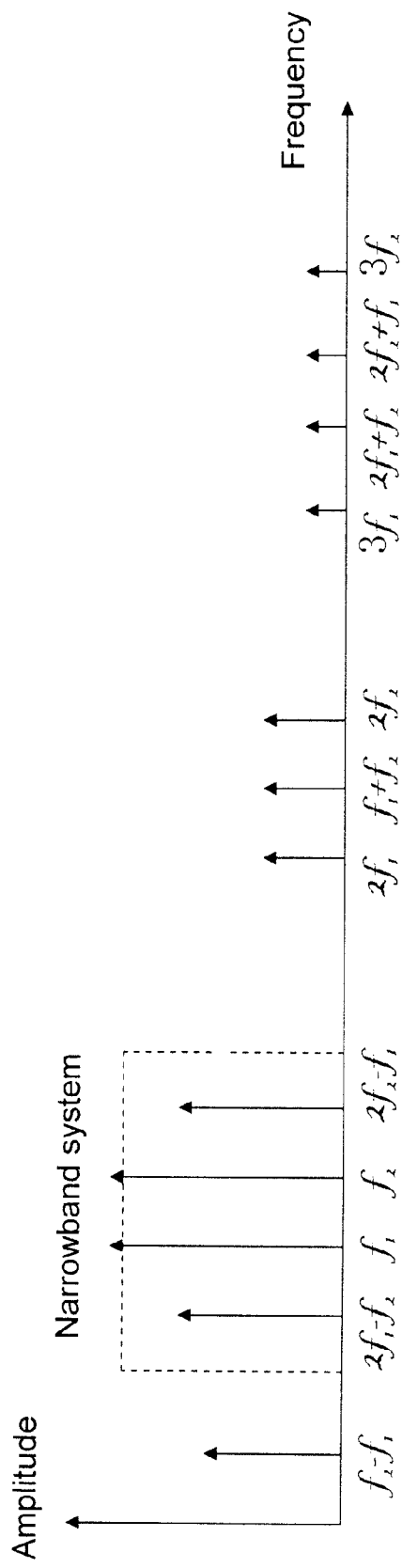
FIG. 7 is an amplitude versus frequency plot of inter-modulation artifacts in a radio frequency signal.
Figure 8:
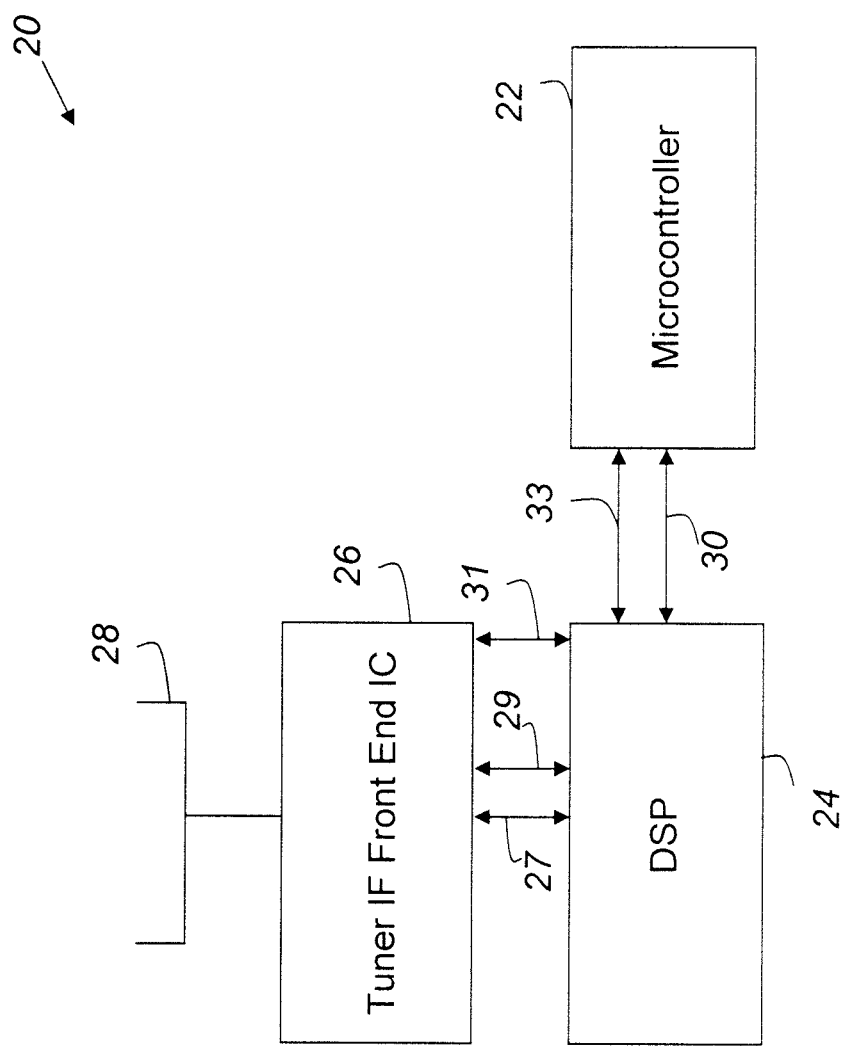
FIG. 8 is a block diagram of one embodiment of a single tuner radio system of the present invention.

Referring now to FIG. 8, there is shown one embodiment of a single tuner radio system 20 of the present invention. Radio system 20 may include a microcontroller 22 which may be used to process user input. A digital signal processor (DSP) 24 may be used to provide audio demodulation of the airborne intermediate frequency (IF) input signal. DSP 24 may also be used to provide quality information parameters to the main microcontroller 22 via a serial communication protocol such as I2C. The quality information parameters may include multipath, adjacent channel noise, FM frequency offset, FM modulation and field strength. The I2C channel may be a dedicated channel so that delays due to shared resource contentions are prevented. DSP 24 may rely on a Tuner IF Front End IC 26 to perform the front end RF demodulation and the gain control. Tuner IF Front End IC 26 may also output the Intermediate Frequency to DSP 24 where the Intermediate Frequency may be demodulated and processed. Tuner IF Front End IC 26 may further provide a gain to the IF (Intermediate Frequency) signal of up to 6 dBuV prior to forwarding the signal to DSP 24. Communication between Tuner IF Front End IC 26 and DSP 24, as indicated at 27, may be via a serial communication protocol such as I2C, which may operate at 400 kbps.

An antenna system 28 may be communicatively coupled to Tuner IF Front End IC 26. Antenna system 28 may be in the form of a passive mast, or an active mast of phase diversity, for example.

An AF sample line 29 and an AF hold line 31 provide an interface between DSP 24 and Tuner IF Front End IC 26 to coordinate a quick mute as described hereinbelow. A pause interrupt line 33 between DSP 24 and microcontroller 22 may be used to inform microcontroller 22 whenever a pause occurs.

DSP 24 may provide signal quality parameterization of demodulated tuner audio and may make it available to microcontroller 22 via a serial communication bus 30. In one embodiment, serial communication bus 30 is in the form of a 400 kbps high speed I2C.

The signal parameterization may include field strength, multipath, FM frequency offset, FM modulation and ultrasonic noise. Field strength may give an indication of signal reception and may help determine whether the radio station has good signal coverage in the vicinity of the user. This field strength quality parameter may be applicable for both AM and FM modulation signal reception.

Although the signal can have high field strength, it can be subject to reflections which can arise from trees and tall building which reflect/deflect the signal. The multipath parameter may enable the level of multipath to be ascertained, and may affect reception quality. The multipath quality parameter may be more applicable to FM modulation signal reception than to AM because in AM reception the wavelength is wider.

With regard to the ultrasonic noise quality parameter, it sometimes happens that stations over-modulate their signal leading to adjacent channel interference. For example, in the U.S., FM frequencies are spaced apart 200 kHz. There can arise times in which an adjacent station over-modulates its signal past the 75 kHz modulation and beyond the 50 kHz guard band, which may result in the adjacent station being heard on the tuned-to station's frequency.

With regard to the FM modulation quality parameter, the detector may provide the amount of frequency deviation about the FM carrier center frequency. The amount of frequency deviation may be directly proportional to the audio content being played in the FM station. The typical modulation bounds of this detect is 75 kHz for North America and between 22.5 kHz and 40 kHz for Rest of World and Europe. The FM modulation quality parameter is discussed in more detail hereinbelow.

The quality parameter of FM frequency offset is a measure of misalignment between modulation and demodulation frequencies. The misalignment value is typically small. However, a large offset error in the form of a large misalignment value may signify strong adjacent channel presence. Alternatively, a large offset error in the form of a large misalignment value may signify that the transmitting station is a "pirate" station and is not operating exactly on its assigned frequency, but rather has an inherent offset error. This tends to occur in Italy.

A novel feature of the present invention is the sampling of FM signals while the user is listening to an FM signal as the current foreground source. The difficulty associated with performing the sensitivity check while in FM mode, especially in a single tuner environment, is that the tuner to which the listener is listening has to momentarily switch to another station, perform the quality check, and then re-tune to the listened-to station. The user is not able to listen to the station during the time period between the switching of the station and the re-tuning of the station. This interruption in the signal of the listened-to station may be perceptible by the user, and thus may be a source of annoyance to the user.

If the audio system is in compact disc (CD) mode or is using some other non-tuner source, the bandscan checks of the frequencies can be easily performed as the tuner can perform the checks without the checks being perceptible to the user since the user is listening to a non-tuner source. To be able to perform the checks in an imperceptible manner, the present invention may utilize a DSP including pause detection logic that is able to detect pauses (i.e., periods of silence or unvoiced activity) in the demodulated audio stream. In one embodiment, pause is detected by computing the number of zero crossings in a particular window of time, wherein a zero crossing may be defined as the value where the modulation drops to zero or nearly zero. In addition, or alternatively, pause may be detected by utilizing a signal strength threshold below which the audio may be characterized as being in a pause. In one embodiment, a pause may be recognized when the duration of the pause exceeds about 40 milliseconds.

It may be assumed that the longer the period of time that a pause has gone on, the longer the period of time that the pause will continue in the future. Thus, a quality check may be initiated after a pause has gone on for a predetermined period of time, such as 40 milliseconds, on the assumption that the pause is more likely to continue long enough for the quality check to be completed.

Each recognized pause may interrupt the main microprocessor, which may then query a neighboring frequency for the quality value of the neighboring frequency. The quality value may be a function of multipath, signal strength, FM frequency offset, FM modulation and/or adjacent channel noise (also termed "ultrasonic noise").

Figure 9:
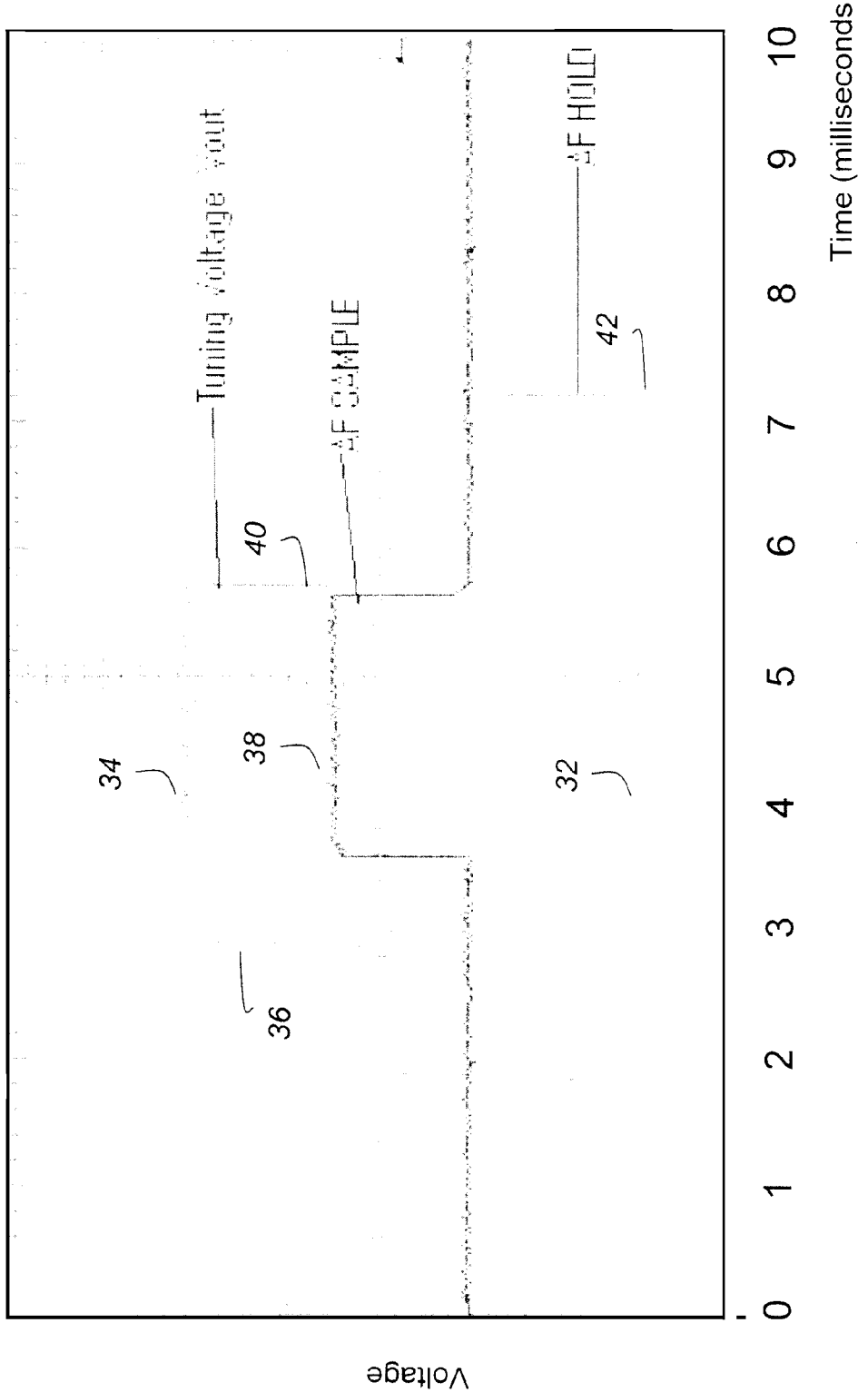
FIG. 9 is a timing diagram depicting muting during a neighbor frequency check according to the present invention.

FIG. 9 is a timing diagram depicting the muting during a neighbor frequency check triggered by the pause detection logic of DSP 24. The muting may occur while the audio frequency (AF) Hold line is LOW, as indicated at 32. In the example illustrated in FIG. 9, the neighbor frequency check indicated at 32 has a duration of about 5.2 milliseconds using Tuner IF Front End IC 26 interacting with DSP 24. The magnitude of the tuning voltage may be dependent on the neighbor frequency jump, i.e., on the frequency difference between the currently listened-to frequency and the neighbor frequency to be checked. The overall time required to perform a neighbor check may be about seven milliseconds in one embodiment. The AF Hold line may go LOW in order to mute the audio prior to the actual tuning of Tuner IF Front End IC 26 to the particular neighboring frequency, which tuning is indicated at 34. After the commencement of tuning, as indicated at 36, about one millisecond may be provided for settling of phase-locked loop (PLL) locking prior to actual sampling being performed during the time that the AF Sample line goes HIGH, as indicated at 38. After the quality AF Sample check, the tuning frequency may be set back to the originally listened-to station, as indicated at 40. After the tuning frequency is set back, time may be provided for PLL setting before the AF Hold Line goes HIGH, as indicated at 42, to unmute the audio of the presently listened-to station.

In one embodiment, after Tuner IF Front End IC 26 has switched to the neighboring frequency, as indicated at 34, the quality sample check is performed to gather readings of the five parameters of fieldstrength, multipath, ultrasonic noise, FM frequency offset and FM modulation. The readings may be gathered via an I2C bus which is set at 400 kbps. In order to promote fast access and avoid having to make five consecutive I2C reads from five separate and disparate memory locations in the DSP for the fieldstrength, multipath, ultrasonic noise, FM frequency offset and FM modulation parameters, DSP 24 may support calling the five registers which hold this information through one I2C read. In order to enable the single I2C read, DSP 24 may support autoincrement and the ability to map disparate memory locations via pointer access. These features may be instrumental in performing the quality sample check within the stipulated time frame and in avoiding the mute, i.e., the interruption of the audible broadcast, from being perceived by passengers of the vehicle.

When the quality sample check is performed on the neighboring frequency, the audio is muted for up to 5.2 milliseconds, i.e., the approximate duration of 32 in FIG. 9, which may be imperceptible by the user.

When the audio system is in tuner mode, each quality sample check may take about seven milliseconds, which may be imperceptible to listeners so long as the quality sample checks are not performed consecutively, i.e., back to back, with no breaks in between. In one embodiment, precautions may be added in order to prevent or inhibit consecutive quality sample checks from being performed. Otherwise, consecutive performance of the checks could result in an interruption of the audible broadcast of greater than seven milliseconds, which could be perceptible to the end user listeners.

Preventing checks from occurring consecutively (e.g., back to back) is a feature of the invention that may be applied to both automated FM station list and AF switching methodology. In order to inhibit or prevent checks from being performed back to back or consecutively, which can result in the user perceiving the audio mute, a one-shot timer may be set each time a check is performed. The setting of the one-shot timer may ensure that even if there were to be a pause detect trigger immediately after a previous pause detect triggered check has been performed, the second check would be performed only if this timer has elapsed. Thus, the quality check may be an AND logic condition, meaning that a pause has occurred AND the timer is not running. If pause occurs and Timer is running, then the quality check is ignored. This consecutive check prevention one-shot timer may be calibratable.

Ensuring quality check efficiency is another feature of the invention that may be applied to both automated FM station list and AF switching methodology. The FM frequency band in the North American market has 102 frequencies ranging from 87.7 MHz to 107.9 MHz. In order to enhance efficiency in the quality sample checks, a trust timer in software may be utilized when quality check is performed on a station frequency to ensure further checks are postponed in order to achieve check efficiency. The timer value may be decremented using speed information provided by a vehicle local area network, or may be decremented by periodic tick. As soon as a station has been sampled for quality, a timer associated with that particular station may be set. As long as the timer is valid (i.e., has a non-zero value), a quality check may not be performed again on that station. Once the timer decrements to zero however, another quality check may be performed.

The trust timer may be decremented either by periodic timer tick or through speed information provided by the local area network within the car. The timer decrement via speed information may be particularly advantageous in one embodiment because if the vehicle is stationary there is no decrement of the timer. The rate of decrement may be dependent upon the speed of the vehicle.

For example, it is possible to sample station 87.5 MHz 0 (index of 87.5 MHz) and an associated trust timer for about fifteen, which time is calibratable. Subsequent checks ignore checking 87.5 MHz until its trust timer expires.

A table depicting one embodiment of a frequency learn memory used to gather apriori information is shown in FIG. 10. The learn memory is the repository from which the subsequent logic may be derived. The learn memory may include 102 entries for the U.S. region (e.g., 87.7 MHz to 107.9 MHz with 200 kHz steps), 205 entries for the worst case FM range (e.g., 87.5 MHz to 108 MHz with 100 kHz steps), and 140 entries for the Japan region (e.g., 76 MHz to 90 MHz with 100 kHz steps).

The invention may be applied to perceptually weighted checks. To complement the pause detect logic check, the invention provides a methodology which triggers a neighborhood frequency check when the currently listened-to station has poor reception quality. More particularly, when the currently listened-to station has poor reception quality, the present invention may "sneak in" a performance check that is not easily perceived by the user. In order to enable such checks, a perceptual weighting filter based on the quality parameter is utilized. The perceptually weighted checks take advantage of the poor signal reception of the presently listened-to station to perform checks.

In order to support the checks, a one shot timer having a duration of 500 ms is used to continuously check on the current quality state of the currently tuned-to station in FM mode. If the quality state indicates noise AND a previous quality check was not performed within the one second time frame, then a quality check is initiated. This one second check guard may ensure that back to back quality checks are not performed, because such back to back checks could be perceived by the user.

The perceptual filter that may be utilized includes a three-dimensional function which inputs field strength, multipath and ultrasonic noise into a quality factor. The three parameters may be received from the DSP through autoincrement registers.

The quality information gathered may be updated into what may be termed a "frequency learn memory," which is mapped onto on-chip RAM. One embodiment of a frequency learn memory for the North American market is shown in FIG. 11.

To optimize on RAM, instead of storing frequency, each frequency may be presented as an index that is mapped over the range. For example, in a frequency range spanning from 87.7 MHz to 107.9 MHz, index 0 represents frequency 87.7 MHz, and index 102 represents 107.9 MHz. To otherwise store the frequency uncoded in BCD format, for example, would consume two bytes, which is not an efficient use of memory.

Quality may be derived from the three-dimensional table taking into consideration fieldstrength, multipath and ultrasonic noise. The trust timer may be a timer value that gets set once a quality check has been performed on a station.

The learn memory may be updated through the following four methods on a single tuner radio. First, when a user is tuned to an FM station and the volume knob is set to a perceivable volume level, then automatic quality checks of neighboring frequencies may be triggered whenever there is a pause in the currently tuned-to station's audio. The novelty of this idea is extended in the second through fourth options described below.

A second option for the automatic update of the FM station list is that when a user is tuned to an FM station and the volume knob is set to a perceivable volume level, then automatic quality checks of neighboring frequencies may be triggered whenever the currently tuned-to audio signal quality is poor. In one embodiment, the present invention provides a novel perceptual based table which characterizes the signal quality level. The characterization of the signal quality level may be used to trigger a 7 ms long, unperceivable quality check of a neighboring frequency.

A third option for the automatic update of the FM station list is that when a user is tuned to an FM station and the volume knob is set to total mute (or if a mute pushbutton is activated), then the neighboring frequencies are checked and updated onto the FM learn memory.

A fourth option for the automatic update of the FM station list is that when a user is sourced to a non-tuner source (e.g., CD mode, auxiliary mode), then the update of the FM station list can freely be performed without the concern that the update will be perceived by the user. Dual tuner radios may not have this limitation, as the second tuner can scan the FM memory and keep it updated.

Figure 12:
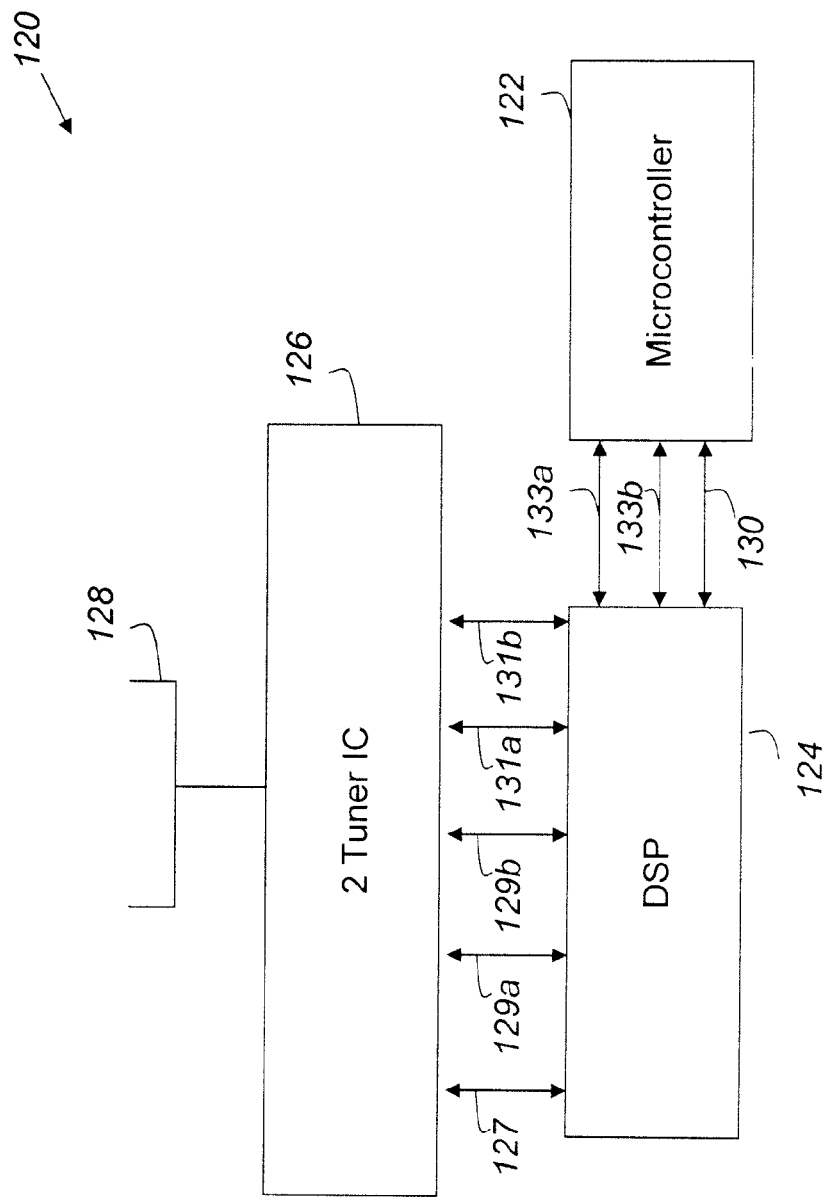
FIG. 12 is a block diagram of one embodiment of a dual tuner radio system of the present invention.

The invention may be applied to AF switching methodology in a dual tuner radio. A dual tuner radio system 120 of the present invention is illustrated in FIG. 12. Dual tuner radio system 120 may include a microcontroller 122 which may be used to process user input. A digital signal processor (DSP) 124 may be used to provide audio demodulation of the airborne IF input signal. DSP 124 may also be used to provide quality information parameters to the main microcontroller 122 via a serial communication protocol such as I2C. The quality information parameters may include multipath, adjacent channel noise, FM frequency offset, FM modulation and field strength. The I2C channel may be a dedicated channel so that delays due to shared resource contentions are prevented. DSP 124 may rely on a Two-tuner IC 126 to perform the front end RF demodulation and the gain control. Two-tuner IC 126 may also output the Intermediate Frequency to DSP 124 where the Intermediate Frequency may be demodulated and processed. Two-tuner IC 126 may further provide a gain to the IF (Intermediate Frequency) signal of up to 6 dBuV prior to forwarding the signal to DSP 124. Communication between Two-tuner IC 126 and DSP 124, as indicated at 127, may be via a serial communication protocol such as I2C, which may operate at 400 kbps.

An antenna system 128 may be communicatively coupled to Two Tuner IC 126. Antenna system 128 may be in the form of a passive mast, or an active mast of phase diversity, for example.

AF sample lines 129a-b and AF hold lines 131a-b provide an interface between DSP 124 and Tuner IC 126 to coordinate a quick mute as described hereinbelow. In contrast to the single tuner embodiment of FIG. 8, this dual tuner embodiment of FIG. 12 includes a separate AF Sample, AF Hold and Pause sensor for the second tuner path. Pause interrupt lines 133a-b between DSP 124 and microcontroller 122 may be used to inform microcontroller 122 whenever a pause occurs either on the primary or secondary tuner paths.

DSP 124 may provide signal quality parameterization of demodulated tuner audio and may make it available to microcontroller 122 via a serial communication bus 130. In one embodiment, serial communication bus 130 is in the form of a 400 kbps high speed I2C.

For dual tuner variants, second tuner may be used to conduct the PI check in an unperceived manner since the user is listening to the main tuner for the audio source. This allows the frequency learn memory to be updated with respect to quality metrics more easily than with single tuner radios, especially when the user is sourced to either AM or FM source.

Figure 13:
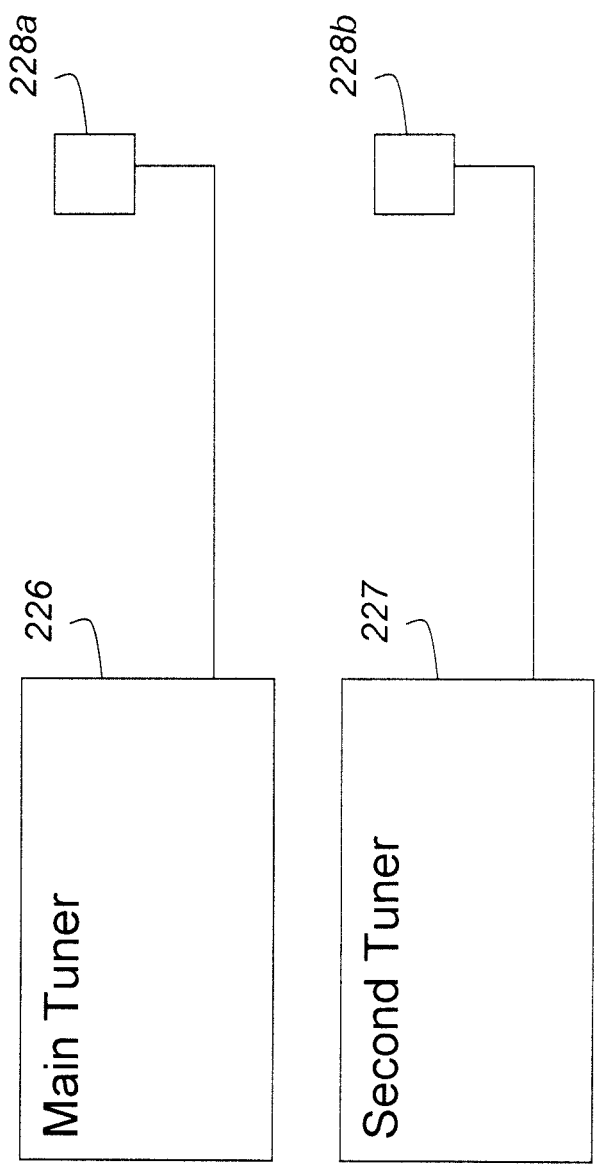
FIG. 13 is a block diagram of one embodiment of a dual tuner phase diversity system of the present invention.

Dual tuner radio variants can be of either the phase diversity type or the external switching diversity type. On dual tuner variants with phase diversity (FIG. 13), a main tuner 226 is connected to an antenna 228a, and a second tuner 227 is connected to an antenna 228b. While main tuner 226 produces an audio signal, second tuner 227 can scan the FM spectrum in the background until the main tuned-to station experiences severe multipath. In response to the severe multipath, the background scanning may be ceased and second tuner 227 may tune to the same station that main tuner 226 is tuned to. Thus, the audio quality may be enhanced by using algorithms known as Constant Modulus Algorithm (CMA) that make use of the phase differences between the main tuner demodulated audio and the second tuner demodulated audio. For dual tuner variants with phase diversity, whenever the phase diversity is functionally enabled, the dual tuner in part operates mostly as a single tuner radio.

Figure 14:
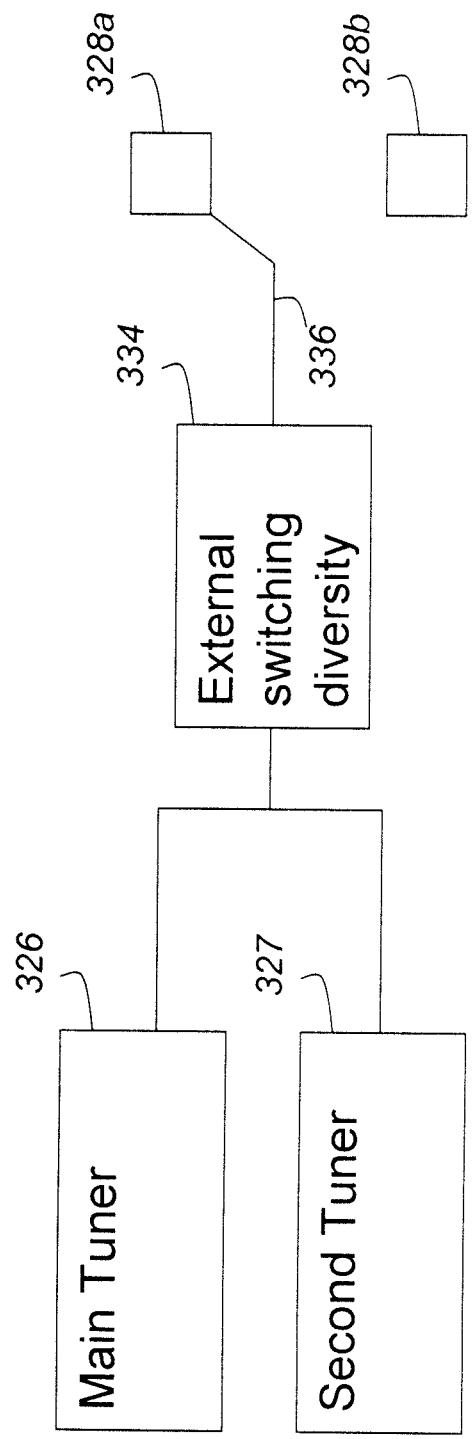
FIG. 14 is a block diagram of one embodiment of a dual tuner external switched diversity system of the present invention.

On dual tuner variants with external switching diversity (FIG. 14), a main tuner 326 and a second tuner 327 are associated with antennas 328a-b. While main tuner 326 produces an audio signal, second tuner 327 is constantly engaged in background scanning. The diversity in tuner variants with external switching diversity is a front end switching circuitry box 334 which chooses the better antenna signal quality. For example, as shown in FIG. 9, box 334 determines that antenna 328a is the stronger antenna, and thus chooses antenna 328a, as indicated at 336.

The frequency learn memory contains the updated information of the station frequency landscape that is currently available to the car radio. The invention provides different methods of updating the learn memory by use of single and dual tuners.

Using the quality metrics gathered in the frequency learn memory, the inventive system can employ various methods to detect the existence of an inter-modulation artifact. A first method of detecting an inter-modulation artifact includes inter-modulation detection, in which the learn memory may be checked through for all frequencies above a calibratable threshold, such as 70 dBuV for example.

In a second method of detecting an inter-modulation artifact, if the frequency signal quality is greater than or equal to 70 dbuV, and if the number of stations found equals two, then third order 2f1+/−f2 and 2f1+/−f2 combinations are computed. It may be checked whether the frequency is within range of the FM band, which varies based on the region. The FM band is 87.5 to 108.0 MHz for Europe (ECE) and rest of world (ROW); 76 to 90 MHz for Japan; and 87.75 to 107.9 MHz for the North American market.

In a third method of detecting an inter-modulation artifact, if the number of stations found equals three, then combinations of f1+/−f2+/−f3 are computed and a check is made that the frequencies are within range of the respective tuner region (e.g., 87.7 to 107.9 MHz in the U.S.; 76 to 90 MHz in Japan; and 87.5 to 108.0 MHz in the Rest Of World). If the frequencies are within range of the respective tuner region, then a bit is set for these frequencies in learn memory along with a trust timer. For example, a valid count down timer may be set for fifteen minutes, or some other chosen time period. As long as the trust timer is running, the radio may be able to judge this station and skip this station frequency in Autoseek, AF switching and DAB FM link use cases.

The present invention may improve the tuner reception quality performance by avoiding third order inter-modulation artifacts in single and dual tuner radio variants in the presence of strong signal environment. The inventive method can be applied to car radios, and FM receivers in mobile devices such as cell phones, USB-FM receivers, etc.

The inventive method for detection of inter-modulation uses apriori information in improving several different applications. First, RDS AF switching behavior may be improved in single and dual tuner radios by ensuring that the radio does not switch to a tainted inter-modulation frequency.

Second, RDS preset recall performance may be improved by using the Tune by PI code to ensure that the alternative frequency picked for reception is not a frequency tainted by inter-modulation artifacts.

Third, Auto-seek seek stop performance may be improved in the FM mode to ensure that seek stop does not occur at an inter-modulation artifact.

Fourth, in Europe, DAB FM link occurs when a user is tuned to a digital DAB station. When the BER (Bit Error Rate) increases, the decoding of the MP2 compressed audio stream becomes difficult for the DAB receiver. In such a circumstance, the radio typically falls back on the simulcast FM station frequency to produce audio. FM stations in Europe employ RDS which categorizes stations with a program ID code whereby multiple frequencies are associated with a single station. In such a case, a Tune by PI operation to trigger the DAB FM link may ensure that the final strongest alternative frequency picked for tune operation in the FM band is not an inter-modulation artifact.

Fifth, the invention may reduce effects of inter-modulation in the scenario where the user manually tunes to a station, and the radio computes the station to be a known inter-modulation tainted station frequency. For example, the radio may narrow the bandwidth of filtering in order to filter out the inter-modulation artifact. If the radio determines that it is tuned to a frequency that is itself an inter-modulation artifact, then the radio may switch to one of the "pure" frequencies that contribute to the inter-modulation artifact.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A radio comprising:
a tuner configured to tune to a primary frequency; and
a controller configured to:
identify a candidate alternate frequency;
determine whether the candidate alternate frequency is a third order inter-modulation artifact; and
cause the tuner to switch tuning from the primary frequency to the candidate alternate frequency only if it is determined that the candidate alternate frequency is not a third order inter-modulation artifact.

2. The radio of claim 1 wherein the controller is configured to ascertain whether content of the candidate alternate frequency is equivalent to content of the primary frequency, the ascertaining being performed only if it is determined that the candidate alternate frequency is not a third order inter-modulation artifact, the controller being configured to cause the tuner to switch tuning from the primary frequency to the candidate alternate frequency only if it is ascertained that the content of the candidate alternate frequency is equivalent to the content of the primary frequency.

3. The radio of claim 2 wherein the ascertaining and the switching are performed during a pause in a currently tuned-to frequency.

4. The radio of claim 2 wherein the ascertaining is performed only if it is determined that a signal quality of the candidate alternate frequency exceeds a threshold signal quality level.

5. The radio of claim 1 wherein the controller is configured to perform a program identification check for the candidate alternate frequency only if it is determined that the candidate alternate frequency is not a third order inter-modulation artifact.

6. The radio of claim 1 wherein the controller is configured to identify two frequencies f1 and f2 within an FM band that have a signal quality above a threshold level, the determining including determining whether the candidate alternate frequency equals either:

$$L*f1+M*f2;\text{ or}$$

$$L*f1-M*f2$$

wherein L and M are integers and L+M=3.

7. The radio of claim 1 wherein the controller is configured to identify three frequencies f1, f2 and f3 within an FM band that have a signal quality above a threshold level, the determining including determining whether the candidate alternate frequency equals either:

$$L*f1+M*f2+N*f3;$$

$$L*f1+M*f2-N*f3;$$

$$L*f1-M*f2+N*f3;\text{ or}$$

$$L*f1-M*f2-N*f3$$

wherein L, M and N are integers and L+M+N=3.

8. The radio of claim 1 wherein the controller is configured to cause the tuner to tune to the candidate alternate frequency in an autoseek operation only if it is determined that the candidate frequency is not a third order inter-modulation artifact.

9. The radio of claim 1 wherein the controller is configured to cause the tuner to switch tuning from the primary frequency to the candidate alternate frequency only if it is ascertained that a signal quality of the candidate alternate frequency is better than a signal quality of the primary frequency.

10. A radio comprising:
a tuner configured to selectively tune to a plurality of frequencies; and
a controller configured to:
cause the tuner to scan a radio frequency band for a candidate frequency having a quality exceeding a threshold quality level;
determine whether the candidate frequency is a third order inter-modulation artifact; and
cause the tuner to tune to the candidate frequency only if it is determined that the candidate frequency is not a third order inter-modulation artifact.

11. The radio of claim 10 wherein the controller is configured to cause the tuner to switch tuning from a primary frequency to the candidate frequency in an alternate frequency switching operation only if it is determined that the candidate frequency is not a third order inter-modulation artifact.

12. The radio of claim 10 wherein the scanning includes scanning the radio frequency band for a candidate frequency having a signal quality metric exceeding a threshold signal quality metric, the signal quality metric being dependent upon at least one of field strength, multipath, adjacent channel energy, frequency offset and FM modulation.

13. The radio of claim 10 wherein the controller is configured to identify two frequencies f1 and f2 within an FM band that have a signal quality above a threshold level, the determining including determining whether the candidate frequency equals either:

$$L*f1+M*f2;\text{ or}$$

$$L*f1-M*f2$$

wherein L and M are integers and L+M=3.

14. The radio of claim 10 wherein the controller is configured to identify three frequencies f1, f2 and f3 within an FM band that have a signal quality above a threshold level, the determining including determining whether the candidate frequency equals either:

$$L*f1+M*f2+N*f3;$$

$$L*f1+M*f2-N*f3;$$

$$L*f1-M*f2+N*f3;\text{ or}$$

$$L*f1-M*f2-N*f3$$

wherein L, M and N are integers and L+M+N=3.

15. A radio comprising:
a tuner configured to selectively tune to a plurality of frequencies; and
a controller configured to:
identify a plurality of first frequencies within an FM band that have a signal quality above a threshold level;
calculate a plurality of second frequencies that are third order inter-modulation artifacts of the first frequencies; and
inhibit the tuner from tuning to the second frequencies.

16. The radio of claim 15 wherein the inhibiting is performed in an alternative frequency switching operation.

17. The radio of claim 15 wherein the inhibiting is performed in an autoseek operation.

18. The radio of claim 15 wherein the controller is configured to determine the signal qualities of the first frequencies by measuring field strength, multipath, adjacent channel energy, frequency offset and/or FM modulation of the first frequencies.

19. The radio of claim 15 wherein the calculating includes calculating, for two said first frequencies f1 and f2:

$$L*f1+M*f2;\text{ and}$$

$$L*f1-M*f2$$

for each combination of L and M wherein L and M are integers and L+M=3.

20. The radio of claim 15 wherein the calculating includes calculating, for three said first frequencies f1, f2 and f3:

$$L*f1+M*f2+N*f3;$$

$$L*f1+M*f2-N*f3;$$

$$L*f1-M*f2+N*f3;\text{ and}$$

$$L*f1-M*f2-N*f3$$

for each combination of L, M and N wherein L, M and N are integers and L+M+N=3.

* * * * *